United States Patent
You et al.

(10) Patent No.: US 11,600,711 B2
(45) Date of Patent: *Mar. 7, 2023

(54) SEMICONDUCTOR DEVICES HAVING GATE STRUCTURES WITH SKIRT REGIONS

(71) Applicant: Samsung Electronics Co., Ltd., Suwon-si (KR)

(72) Inventors: Jung-Gun You, Ansan-si (KR); Myung-Yoon Um, Seoul (KR); Young-Joon Park, Seoul (KR); Jeong-Hyo Lee, Suwon-si (KR); Ji-Yong Ha, Seoul (KR); Jun-sun Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 102 days.

This patent is subject to a terminal disclaimer.

(21) Appl. No.: 17/329,240

(22) Filed: May 25, 2021

(65) Prior Publication Data
US 2021/0280682 A1    Sep. 9, 2021

Related U.S. Application Data

(63) Continuation of application No. 16/220,028, filed on Dec. 14, 2018, now Pat. No. 11,043,568, which is a
(Continued)

(30) Foreign Application Priority Data

Jan. 14, 2015  (KR) ........................ 10-2015-0006772

(51) Int. Cl.
*H01L 29/423*   (2006.01)
*H01L 29/78*    (2006.01)
(Continued)

(52) U.S. Cl.
CPC .. *H01L 29/42376* (2013.01); *H01L 21/28114* (2013.01); *H01L 21/76224* (2013.01);
(Continued)

(58) Field of Classification Search
CPC ......... H01L 29/42372–4238; H01L 29/66545; H01L 29/66795–66818;
(Continued)

(56) References Cited

U.S. PATENT DOCUMENTS 5,844,278 A   12/1998  Mizuno et al.
6,919,601 B2   7/2005  Inaba
(Continued)

FOREIGN PATENT DOCUMENTS

JP    10-093093      4/1998
KR    10-2004-0091309   10/2004

*Primary Examiner* — Yu Chen
(74) *Attorney, Agent, or Firm* — Myers Bigel, P.A.

(57) ABSTRACT

Provided are a semiconductor device and a method for fabricating the same. The semiconductor device includes an active fin protruding upwardly from a substrate and extending in a first direction and a gate structure extending in a second direction intersecting to cross the active fin, where a first width of a lower portion of the gate structure that contacts the active fin is greater than a second width of the lower portion of the gate structure that is spaced apart from the active fin.

19 Claims, 22 Drawing Sheets

Related U.S. Application Data continuation of application No. 14/988,819, filed on Jan. 6, 2016, now Pat. No. 10,192,968.

(60) Provisional application No. 62/104,539, filed on Jan. 16, 2015.

(51) Int. Cl.

| | | |
|---|---|---|
| *H01L 21/28* | (2006.01) | |
| *H01L 29/40* | (2006.01) | |
| *H01L 29/66* | (2006.01) | |
| *H01L 21/762* | (2006.01) | |
| *H01L 21/8234* | (2006.01) | |
| *H01L 27/092* | (2006.01) | |
| *H01L 21/8238* | (2006.01) | |
| *H01L 27/088* | (2006.01) | |
| *H01L 29/49* | (2006.01) | |

(52) U.S. Cl.
CPC ........ *H01L 21/823431* (2013.01); *H01L 21/823481* (2013.01); *H01L 21/823821* (2013.01); *H01L 27/0886* (2013.01); *H01L 27/0924* (2013.01); *H01L 29/401* (2013.01); *H01L 29/4238* (2013.01); *H01L 29/66545* (2013.01); *H01L 29/66795* (2013.01); *H01L 29/7851* (2013.01); *H01L 29/7853* (2013.01); *H01L 21/28088* (2013.01); *H01L 29/4966* (2013.01); *H01L 29/7848* (2013.01)

(58) Field of Classification Search
CPC . H01L 29/785–7856; H01L 2029/7857; H01L 2029/7858; H01L 27/0886; H01L 27/0924; H01L 21/28114; H01L 21/823431; H01L 21/823821
See application file for complete search history.

(56) References Cited

U.S. PATENT DOCUMENTS

| | | |
|---|---|---|
| 7,482,628 B2 | 1/2009 | Kang et al. |
| 2008/0296667 A1 | 12/2008 | Mikasa |
| 2010/0207209 A1 | 8/2010 | Inokuma |
| 2013/0307038 A1 | 11/2013 | Toh et al. |
| 2014/0061817 A1 | 3/2014 | Gan et al. |
| 2014/0091362 A1 | 4/2014 | Chang et al. |
| 2014/0183599 A1 | 7/2014 | Hong et al. |
| 2014/0197458 A1 | 7/2014 | Ching et al. |
| 2014/0217479 A1 | 8/2014 | Colinge et al. |
| 2014/0231921 A1 | 8/2014 | Liaw |
| 2014/0239393 A1 | 8/2014 | Kuo et al. |
| 2014/0248751 A1 | 9/2014 | Cheng et al. |
| 2014/0264387 A1 | 9/2014 | Reznicek et al. |
| 2014/0264575 A1 | 9/2014 | Tsai et al. |
| 2014/0264590 A1 | 9/2014 | Yu et al. |
| 2014/0273464 A1 | 9/2014 | Shieh et al. |
| 2014/0282332 A1 | 9/2014 | Katoch et al. |
| 2014/0291770 A1 | 10/2014 | Yin et al. |
| 2014/0312388 A1 | 10/2014 | Colinge |
| 2015/0054029 A1 | 2/2015 | Jangjian et al. |
| 2015/0187946 A1 | 7/2015 | Park et al. |
| 2016/0093715 A1 | 3/2016 | Liu et al. |
| 2016/0099246 A1 | 4/2016 | Basker et al. |

1

1200

1300

1400

SEMICONDUCTOR DEVICES HAVING GATE STRUCTURES WITH SKIRT REGIONS

CROSS-REFERENCE TO RELATED APPLICATIONS

This application is a continuation of U.S. application Ser. No. 16/220,028 filed Dec. 14, 2018, which is a continuation of U.S. application Ser. No. 14/988,819 filed Jan. 6, 2016, which claims priority under 35 U.S.C. § 119 to Korean Patent Application No. 10-2015-0006772 filed Jan. 14, 2015 in the Korean Intellectual Property Office and to U.S. Provisional Patent Application No. 62/104,539 filed Jan. 16, 2015 in the United States Patent and Trademark Office, the content of each of which is incorporated herein by reference.

BACKGROUND

A multi-gate transistor has been proposed as a potential technique for increasing the density of integrated circuit devices. A multi-gate transistor has a fin-shaped or nanowire-shaped semiconductor body that is formed on a substrate and a gate is then formed on a surface of the semiconductor body. Since multi-gate transistors use three-dimensional (3D) channels, scaling of the multi-gate transistor is easily achieved. In addition, current controlling capability can be improved without increasing a gate length of the multi-gate transistor. Further, a short channel effect (SCE), in which an electric potential of a channel region is affected by a drain voltage, can be suppressed in multi-gate transistors.

SUMMARY

The inventive concepts provide semiconductor devices having improved operating characteristics.

According to an aspect of the inventive concepts, there is provided a semiconductor device including an active fin protruding from a substrate and extending in a first direction, a gate structure extending in a second direction that intersects the first direction, the gate structure on the active fin, and a field insulation layer on a bottom portion of a long side of the active fin, the intersection of a top surface of the field insulation layer and the active fin defining at least one line segment, where the gate structure includes a skirt that extends outwardly in the first direction to cover a portion of the at least one line segment while leaving another portion of the at least one line segment exposed.

According to another aspect of the inventive concepts, there is provided a semiconductor device including first and second active fins protruding upwardly from a substrate and extending in parallel to each other in a first direction, and a first gate structure extending in a second direction that intersects the first direction, the first gate structure on the active fin and on the second active fin, wherein the first gate structure includes a first skirt where a first side of the first gate structure extends outwardly in the first direction to contact a first side of the first active fin, a second skirt where a second side of the first gate structure extends outwardly in the first direction to contact the first side of the first active fin, the second side of the first gate structure being opposite the first side of the first gate structure, a third skirt where the first side of the first gate structure extends outwardly in the first direction to contact a first side of the second active fin that faces the first side of the first active fin, and a fourth skirt where the second side of the first gate structure extends outwardly in the first direction to contact the first side of the second active fin.

According to still another aspect of the inventive concepts, there is provided a semiconductor device including an active fin protruding from a substrate and extending in a first direction, a gate structure extending in a second direction that intersects the first direction, the gate structure crossing the active fin, and a dummy gate structure extending in the second direction to cross the active fin, the active fin having an end positioned under the dummy gate structure, wherein the dummy gate structure includes a first skirt where a first side of the dummy gate structure extends outwardly in the first direction to contact a side surface of the active fin.

According to a further aspect of the inventive concepts, there is provided a semiconductor device including first and second active fins protruding from a substrate and extending in parallel to each other in a first direction, a first gate structure extending in a second direction that intersects the first direction, the first gate structure on the first and second active fins, and a second gate structure extending parallel to the first gate structure, the second gate structure on the first and second active fins, wherein the first gate structure includes a first region adjacent the first active fin and a second region that is spaced apart from the first and second active fins, the first region having a greater width than the second region, and the second gate structure includes a third region adjacent the first active fin and a fourth region that is spaced apart from the first and second active fins, the third region having a greater width than the fourth region.

According to yet another aspect of the inventive concepts, there is provided a semiconductor device including an active fin protruding from a substrate and extending in a first direction, a field insulation layer adjacent a long side of the active fin, a gate structure extending in a second direction on the field insulation layer to intersect the active fin, and spacers on at least one side of the gate structure and extending in the second direction, wherein the gate structure includes a first portion where the gate structure extends underneath the spacer and a second portion where the gate structure does not extend underneath the spacer.

According to yet another aspect of the inventive concepts, there is provided a semiconductor device that includes a substrate, an active fin protruding upwardly from the substrate and extending in a first direction, and a gate structure that extends in a second direction to cross the active fin, wherein a first width of a lower portion of the gate structure that contacts the active fin is greater than a second width of the lower portion of the gate structure that is spaced apart from the active fin.

DETAILED DESCRIPTION OF THE EMBODIMENTS

Figure 1:
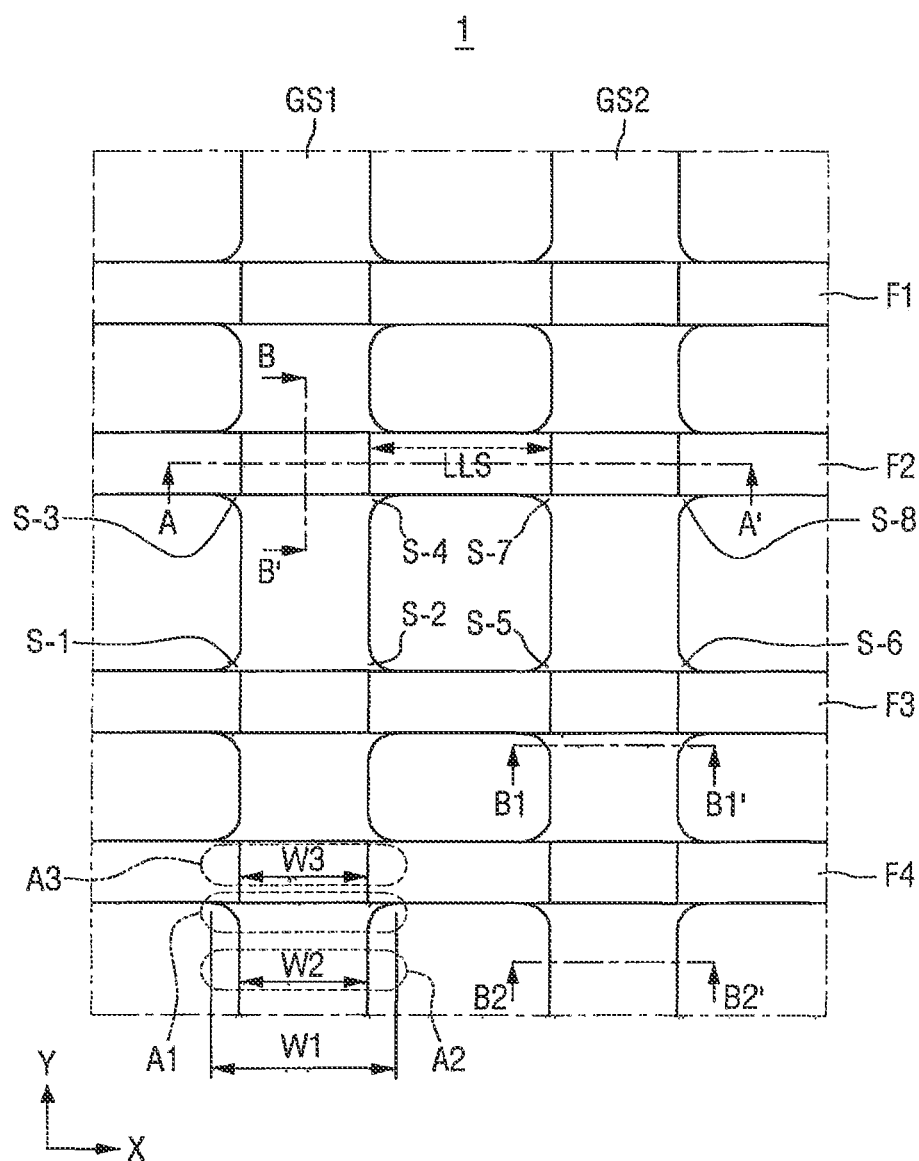
FIG. 1 is a layout view illustrating gate structures and active fins of a semiconductor device according to an embodiment of the inventive concepts.

Embodiments of the inventive concepts will be described in detail with reference to the accompanying drawings. The inventive concepts, however, may be embodied in various forms, and should not be construed as being limited to the illustrated embodiments. Rather, these embodiments are provided as examples so that this disclosure will be thorough and complete, and will fully convey the inventive concepts to those skilled in the art. Known processes, elements, and techniques may not be described with respect to some of the embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, operations, elements, and/or components, but do not preclude the presence or addition of one or more other features, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent" another element or layer, it can be directly on, connected, coupled, or adjacent the other element or layer, or intervening elements or layers may be present. In contrast, when an element is referred to as being "directly on," "directly connected to", "directly coupled to", or "immediately adjacent" another element or layer, there are no intervening elements or layers present.

Unless otherwise defined, all terms (including technical and scientific terms) used herein have the same meaning as commonly understood by one of ordinary skill in the art to which the inventive concepts belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Hereinafter, a semiconductor device according to an embodiment of the inventive concepts will be described with reference to FIGS. 1 to 4C.

Figure 2:
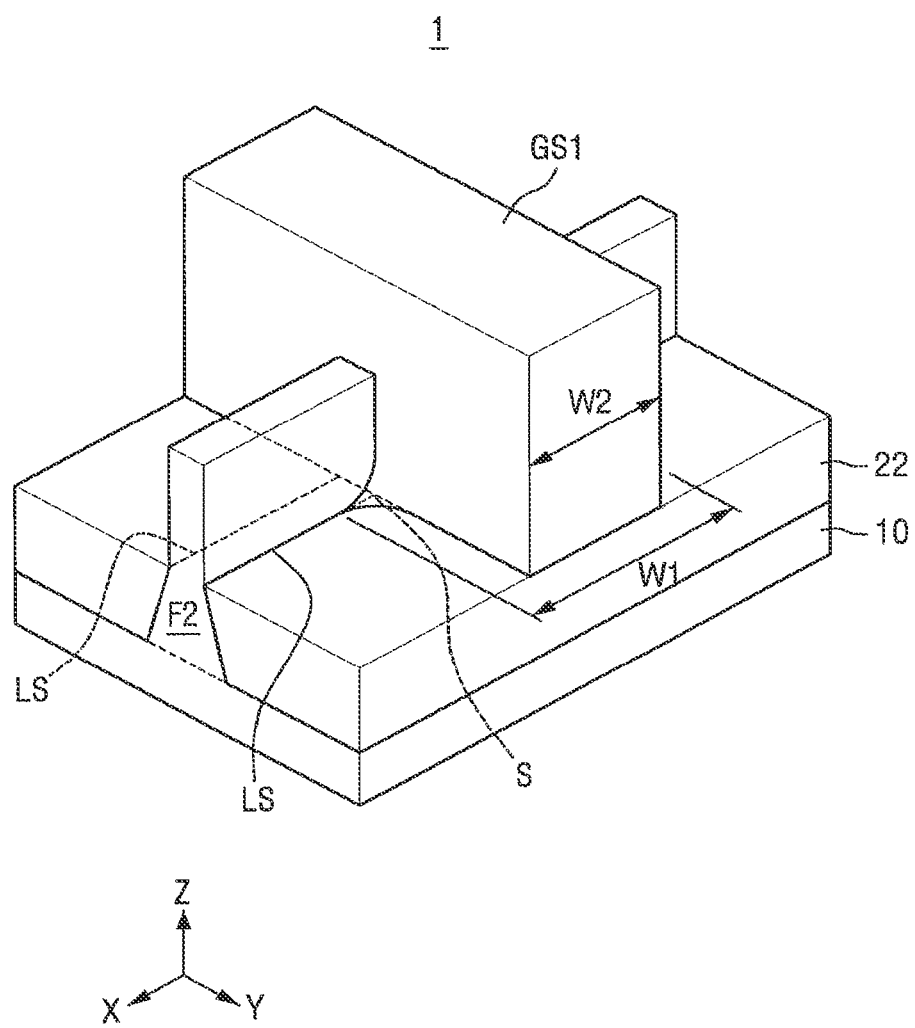
FIG. 2 is a perspective view illustrating one of the gate structures and one of the active fins of the semiconductor device of FIG. 1.
Figure 3:
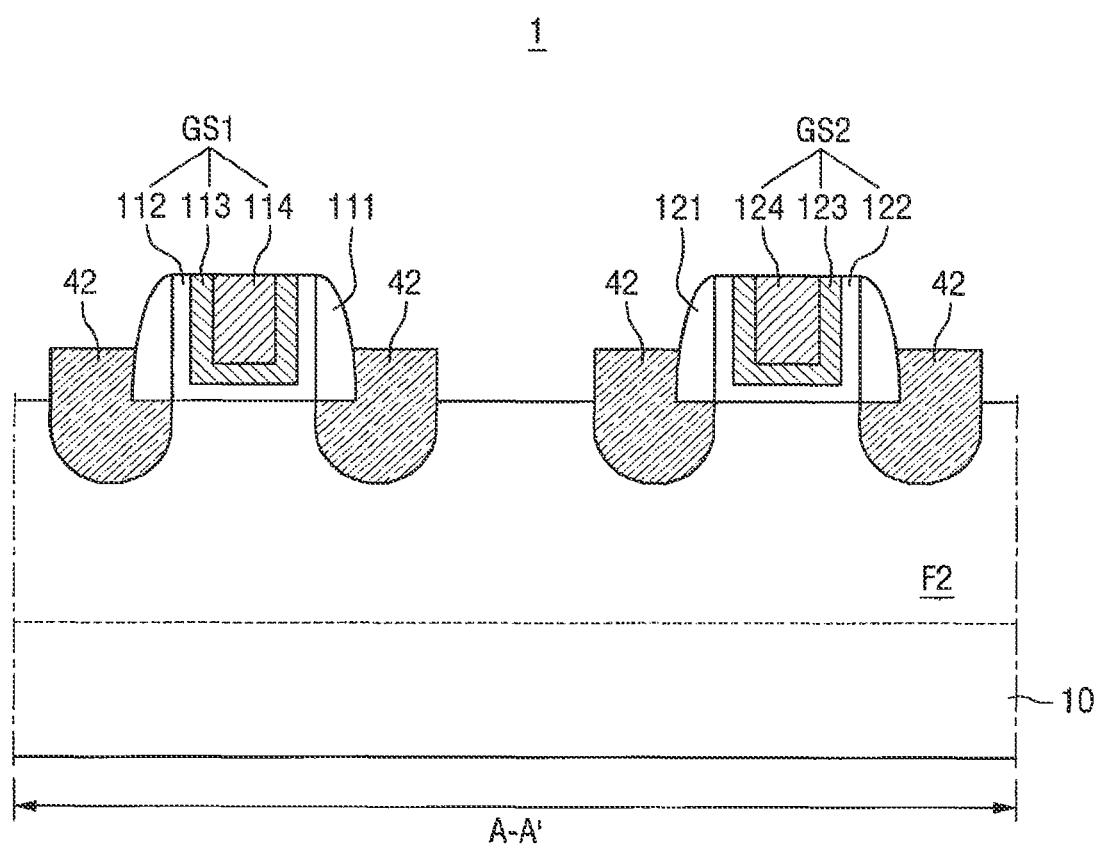
FIG. 3 is a cross-sectional view taken along the line A-A' of FIG. 1.
Figure 4A:
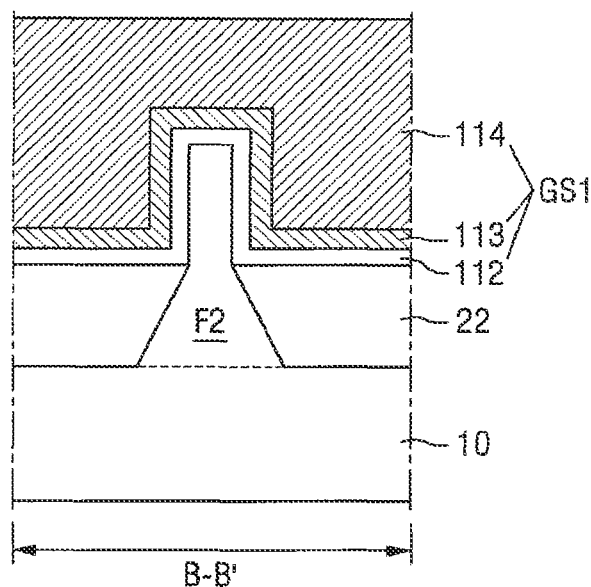
FIG. 4A is a cross-sectional view taken along the line B-B' of FIG. 1.
Figure 4B:
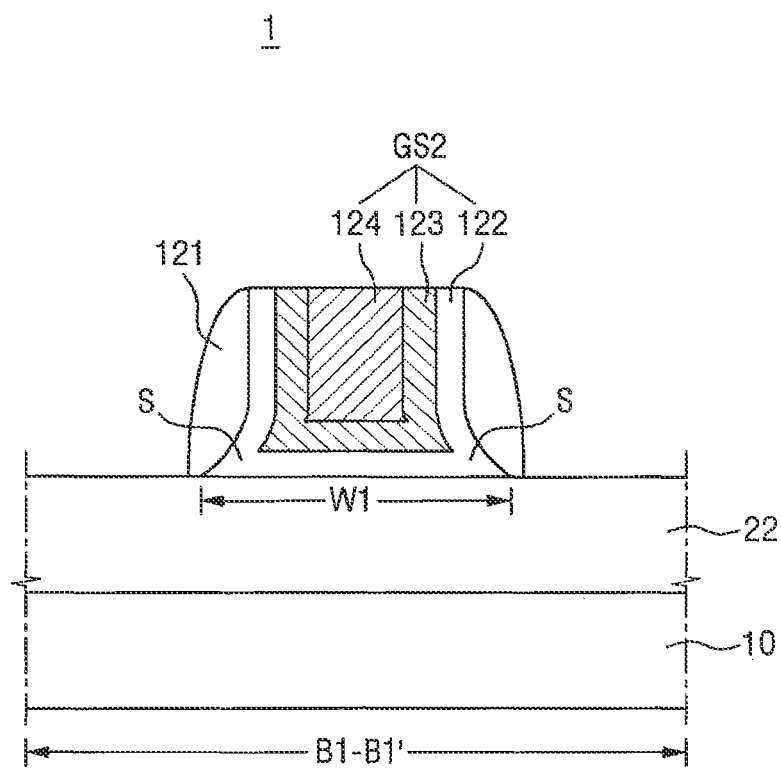
FIG. 4B is a cross-sectional view taken along the line B1-B1' of FIG. 1, illustrating a region A1 of FIG. 1.
Figure 4C:
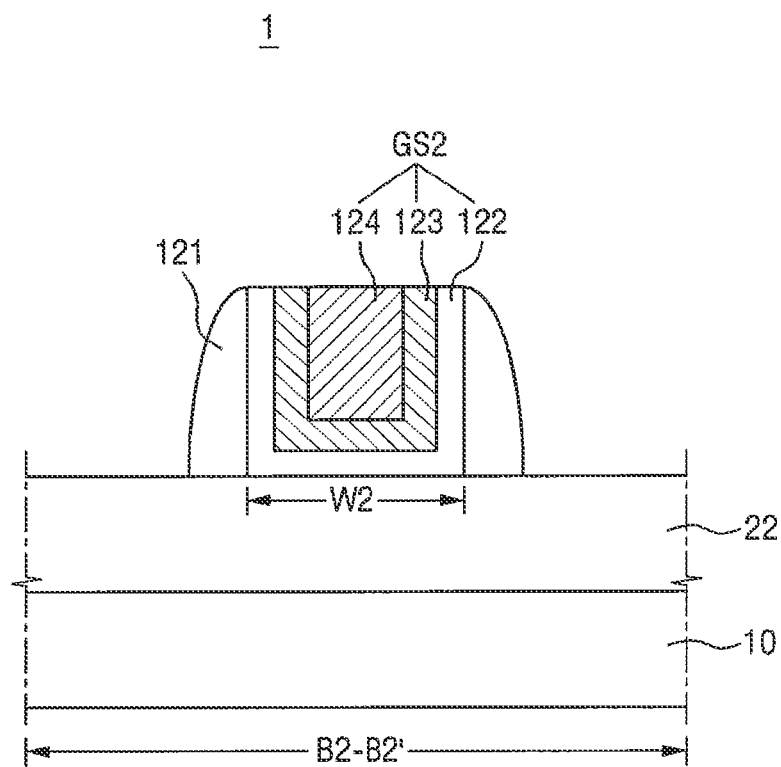
FIG. 4C is a cross-sectional view taken along the line B2-B2' of FIG. 1, illustrating a region A2 of FIG. 1.

FIG. 1 is a layout view illustrating gate structures and active fins of a semiconductor device according to an embodiment of the inventive concepts, FIG. 2 is a perspective view illustrating one of the gate structures and one of the active fins of the semiconductor device of FIG. 1, FIG. 3 is a cross-sectional view taken along the line A-A' of FIG. 1, FIG. 4A is a cross-sectional view taken along the line B-B' of FIG. 1, FIG. 4B is a cross-sectional view taken along the line B1-B1' of FIG. 1, illustrating a region A1 of FIG. 1, and FIG. 4C is a cross-sectional view taken along the line B2-B2' of FIG. 1, illustrating a region A2 of FIG. 1. Note that in FIGS. 1 and 2 spacers that are provided on sides of the gate structures are not illustrated to more clearly show the design of the gate structures. These spacers are shown in FIGS. 3, 4B and 4C.

Referring to FIGS. 1 to 4C, the semiconductor device 1 includes active fins F1 to F4, gate structures GS1 and GS2, and a field insulation layer 22. It will be appreciated that the semiconductor device may include more gate structures and active fins.

The active fins F1 to F4 may protrude from a substrate 10 and may extend in a first direction X.

The substrate 10 may include a semiconductor material. The semiconductor material may include, for example, one or more selected from the group consisting of Si, Ge, SiGe, GaP, GaAs, SiC, SiGeC, InAs and InP. However, aspects of the inventive concepts are not limited thereto, and in other embodiments of the inventive concepts, the substrate 10 may be an insulating substrate such as, for example, a silicon on insulator (SOI) substrate. When the substrate 10 is an SOI substrate, a response speed of the semiconductor device 1 may be improved.

As illustrated in FIG. 1, the active fins F1 to F4 may extend in, for example, a first direction X, and may be spaced apart from each other in, for example, a second direction Y.

Each of the active fins F1 to F4 may have long sides and short sides. In FIG. 1, the long-side direction of the active fins F1 to F4 is the first direction X, and the short-side direction of the active fins F1 to F4 is the second direction Y, but aspects of the inventive concepts are not limited thereto. For example, in other embodiments of the inventive concepts, the long-side direction of the active fins F1 to F4 may be the second direction Y and the short-side direction of the active fins F1 to F4 may be the first direction X.

The active fins F1 to F4 may be formed from respective portions of the substrate 10 and may each include an epitaxial layer that is grown from the substrate 10.

In some embodiments of the inventive concepts, the active fins F1 to F4 may include a semiconductor material. The active fins F1 to F4 may include, for example, Si or SiGe.

In some embodiments of the inventive concepts, the active fins F1 to F4 may include the same material as the substrate 10. When the substrate 10 includes, for example Si, the active fins F1 to F4 may include Si.

However, aspects of the inventive concepts are not limited thereto, and the substrate 10 and the active fins F1 to F4 may include different materials.

When the substrate 10 includes, for example Si, the active fins F1 to F4 may include a different material from Si. In this case, the active fins F1 to F4 may be formed on the substrate 10 through, for example, an epitaxial growth process.

The field insulation layer 22 may be formed on the substrate 10 and may cover lower portions of sidewalls of the active fins F1 to F4 while exposing top portions of the active fins F1 to F4.

As shown, the field insulation layer 22 may be adjacent the long sides of the active fins F1 to F4.

As illustrated in FIG. 2, line segments LS are defined where the top surface of the field insulation layer 22 contacts each long side of the active fins F1 to F4. Portions of each line segment LS may be covered by the gate structures GS1 and GS2 while other portions thereof are exposed, which will be described in detail later.

In some embodiments of the inventive concepts, the field insulation layer 22 may include, for example, one selected from the group consisting of an oxide layer, a nitride layer or an oxynitride layer, but aspects of the inventive concepts are not limited thereto.

The gate structures GS1 and GS2 may extend on the active fins F1 to F4 in a second direction Y so as to intersect the active fins F1 to F4.

While the gate structures GS1 and GS2 are shown in FIG. 1 as extending in the second direction Y, aspects of the inventive concepts are not limited thereto. In embodiments, the gate structures GS1 and GS2 may intersect the first and second fins F1 to F4 at an acute angle and/or an obtuse angle.

As illustrated, the gate structure GS1 may be spaced apart from the gate structure GS2 in the first direction X.

The gate structure GS1 may include a gate insulation layer 112, a work function control layer 113 and a conductive layer 114.

As illustrated in FIG. 3, the gate insulation layer 112 may be formed on a top surface of the active fin F2 and may protrude upwardly from the substrate 10 along sidewalls of a spacer 111.

The gate insulation layer 112 may have the above-described shape because the gate structure GS1 according to the present embodiment is formed by, for example, a gate replacement process.

In addition, as illustrated in FIG. 4A, the gate insulation layer 112 may extend along a top surface of the field insulation layer 22 and side surfaces and a top surface of the active fin F2 in the second direction Y.

The gate insulation layer 112 may include a high-k material having a higher dielectric constant than silicon oxide. The gate insulation layer 112 may include, for example, $HfO_2$, $ZrO_2$, LaO, $Al_2O_3$ or $Ta_2O_5$, but aspects of the inventive concepts are not limited thereto.

The work function control layer 113 and the conductive layer 114 may constitute a gate electrode. The work function control layer 113 may control a work function of the gate electrode and the conductive layer 114 may fill a space formed by the work function control layer 113.

In some embodiments of the inventive concepts, the work function control layer 113 may include a first metal and the conductive layer 114 may include a second metal that is different from the first metal.

The work function control layer 113 may include portions that extend upwardly along a top surface of the gate insulation layer 112 and side surfaces of the conductive layer 114, as illustrated in FIG. 3. The work function control layer 113 may have the above-described shape because the gate structure GS1 according to the present embodiment is formed by, for example, a gate replacement process.

In addition, as illustrated in FIG. 4A, the work function control layer 113 may extend along a top portion of the field insulation layer 22 and sidewalls and a top portion of the active fin F2 in the second direction Y.

The work function control layer 113 may include, for example, at least one of TiAl, TiAlC, TiAlN, HfSi, TiN, TaN, TiC, and TaC and the conductive layer 114 may include, for example, W or Al, but aspects of the inventive concepts are not limited thereto. In other embodiments, the conductive layer 114 may include a non-metal material such as, for example, Si or SiGe. The work function control layer 113 and the conductive layer 114 may be modified to have different configurations.

The spacer 111 may be formed along at least one side of the gate structure GS1. In some embodiments of the inventive concepts, the spacer 111 may be formed along both sides of the gate structure GS1.

In the illustrated embodiment, the spacer 111 has a pillar shape, but aspects of the inventive concepts are not limited thereto. In other embodiments, the spacer 111 may be modified to have various other shapes. In the present embodiment, the spacer 111 may include, for example, a nitride layer such as, for example, a silicon nitride layer.

However, aspects of the inventive concepts are not limited thereto, and other materials may be used to form the spacer 111. In some embodiments of the inventive concepts, the spacer 111 may include, for example, one of an oxide layer and an oxynitride layer.

Impurity epitaxial regions 42 may be formed on the active fins F1 to F4 on opposite sides of the gate structure GS1.

In some embodiments of the inventive concepts, the impurity epitaxial regions 42 may be formed within etched regions of the active fins F1 to F4. The impurity epitasixal regions 42 may fill these respective recesses. The impurity epitaxial regions 42 may be formed on the active fins F1 to F4 by, for example, an epitaxial growth process.

In some embodiments of the inventive concepts, the impurity epitaxial regions 42 may be an elevated source or drain region. Top surfaces of the impurity epitaxial regions 42 may be higher above the substrate 10 than top surfaces of the active fins F1 to F4.

The impurity epitaxial regions 42 may include a semiconductor material. In some embodiments, the impurity epitaxial regions 42 may include, for example, Si, but aspects of the inventive concepts are not limited thereto.

When the semiconductor device 1 includes a PMOS transistor, the impurity epitaxial regions 42 may include a compressive stress material. For example, the compressive stress material may include a material having a larger lattice constant than Si, e.g., SiGe. The compressive stress material may improve the mobility of carriers in channel regions defined in the active fins F1 to F4 by applying compressive stress to the channel regions.

When the semiconductor device 1 includes an NMOS transistor, the impurity epitaxial regions 42 may include the same material as the substrate 10 or a tensile stress material. For example, when the semiconductor device 1 includes Si, the impurity epitaxial regions 42 may include a material having a smaller lattice constant than Si (e.g., SiC or SiP). The tensile stress material may improve the mobility of carriers in channel regions defined in the active fins F1 to F4 by applying tensile stress to the channel regions.

Although not specifically illustrated, an interlayer dielectric layer may be formed that covers the gate structure GS1 and the impurity epitaxial regions 42.

The gate structure GS2 may have substantially the same configuration as the gate structure GS1. In particular, the gate structure GS2 may include a gate insulation layer 122 that has substantially the same configuration as the gate insulation layer 112 that is included in the gate structure GS1, and a work function control layer 123 and a conductive layer 124 that may have substantially the same configurations as the work function control layer 113 and the conductive layer 114 included in the gate structure GS1.

A spacer 121 may be formed on at least one sidewall of the gate structure GS2. The spacer 121 may have substantially the same configuration as the spacer 111 that is formed on at least one sidewall of the gate structure GS1.

In the present embodiment, each gate structure GS1, GS2 may include a skirt S at each region where a side of the gate structure GS1, GS2 intersects a long side of one of the active fins F1 to F4.

As illustrated in FIGS. 1 and 2, each skirt S is a portion of one of the gate structures GS1, GS2 that extends outwardly with a curved profile in the first direction X to cover a portion of respective line segments LS that are defined by the intersections of the top surface of the field insulation layer 22 with the respective active fins F1 to F4.

As illustrated in FIG. 2, each skirt S comprises a lower portion of a side of the gate structure GS1, GS2 that extends outwardly in the first direction X more than the remainder of the side of the gate structure to contact a lower sidewall of a respective one of the active fins F1 to F4.

For example, as illustrated in FIG. 1, a first skirt S-1 extends outwardly from the left side surface of the gate structure GS1 in the first direction X to contact a first long side of the active fin F3 and a second skirt S-2 extends outwardly from the right side surface of the gate structure GS1 in the first direction X to also contact the first long side of the active fin F3.

In addition, as illustrated in FIG. 1, a third skirt S-3 extends outwardly from the left side surface of the gate structure GS1 in the first direction X to contact a first long side of the active fin F2 and a fourth skirt S-4 extends outwardly from the right side surface of the gate structure GS1 in the first direction X to contact the first long side of the active fin F2.

In addition, as illustrated in FIG. 1, a fifth skirt S-5 extends outwardly from the left side surface of the gate structure GS2 in the first direction X to contact the first long side of the active fin F3 and a sixth skirt S-6 extends outwardly from the right side surface of the gate structure GS2 in the first direction X to contact the first long side of the active fin F3.

In addition, as illustrated in FIG. 1, a seventh skirt S-7 extends outwardly from the left side surface of the gate structure GS2 in the first direction X to contact the first long side of the active fin F2 and an eighth skirt S-8 extends outwardly from the right side surface of the gate structure GS2 in the first direction X to contact the first long side of the active fin F2. The second skirt S-2 and the fifth skirt S-5 may be spaced apart from each other so that they are not connected to each other. Likewise, the fourth skirt S-4 and the seventh skirt S-7 may be spaced apart from each other so that they are not connected to each other.

Since the gate structure GS1 includes the above-discussed skirts S, it may have first regions A1 and second regions A2 that have different widths.

In detail, a width W1 of the first region A1 of the gate structure GS1 that is adjacent the active fins F1 to F4 may be larger than a width W2 of the second region A2 of the gate structure GS1 that is spaced apart from the active fins F1 to F4 (i.e., between two adjacent ones of the active fins F1 to F4) and may be larger than a width W3 of a third region A3 of the gate structure GS1 that is on top of the active fins F1 to F4. The second width W2 may be the same as the third width W3.

Likewise, since the gate structure GS2 includes the above-discussed skirts S, it may have first regions A1, second regions A2 and third regions A3. Each first region may have a width that is different from widths of the second regions A2 and the third regions A3. The second regions A2 and the third regions A3 may have the same widths.

In detail, a width W1 of the first region A1 of the gate structure GS2 that is adjacent to the active fins F1 to F4 may be larger than a width W2 of the second region A2 of the gate structure GS2 that is spaced apart from the active fins F1 to F4 and may be larger than a width W3 of a third region A3 of the gate structure GS2 that is on top of the active fins F1 to F4.

In addition, since the gate structure GS2 includes the above-discussed skirts S, as illustrated in FIG. 4B, the gate structure GS2 may extend underneath a lower portion of the spacer 121 in the first region A1 while not extending underneath the lower portion of the spacer 121 in the second region A2, as illustrated in FIG. 4C.

Since the gate structure GS2 includes the above-discussed skirts S, the width W1 of the first region A1 of the gate structure GS2 may be larger than the widths W2 and W3 of the respective second and third regions A2 and A3 of the gate structure GS2.

When the widths of the gate structures GS1, GS2 are larger in the regions adjacent the active fins F1 to F4 (for example, the first region A1), the driving capability of transistors can be improved, thereby, the operating characteristics of the semiconductor device can be improved.

Figure 5:
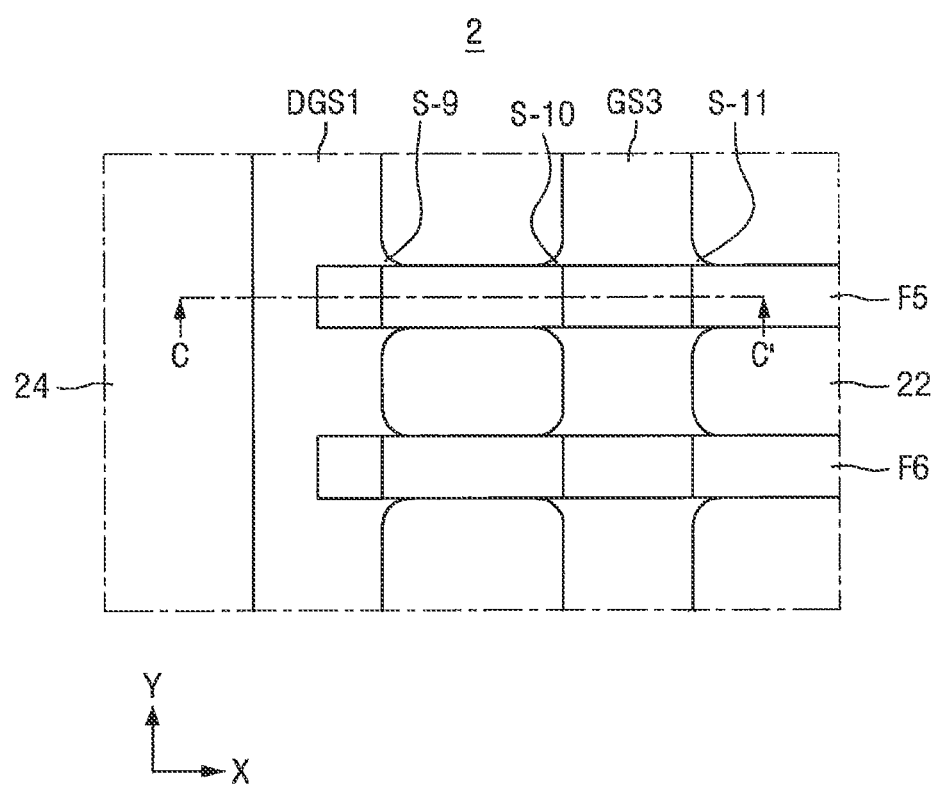
FIG. 5 is a layout view illustrating gate structures and active fins of a semiconductor device according to another embodiment of the inventive concepts.
Figure 6:
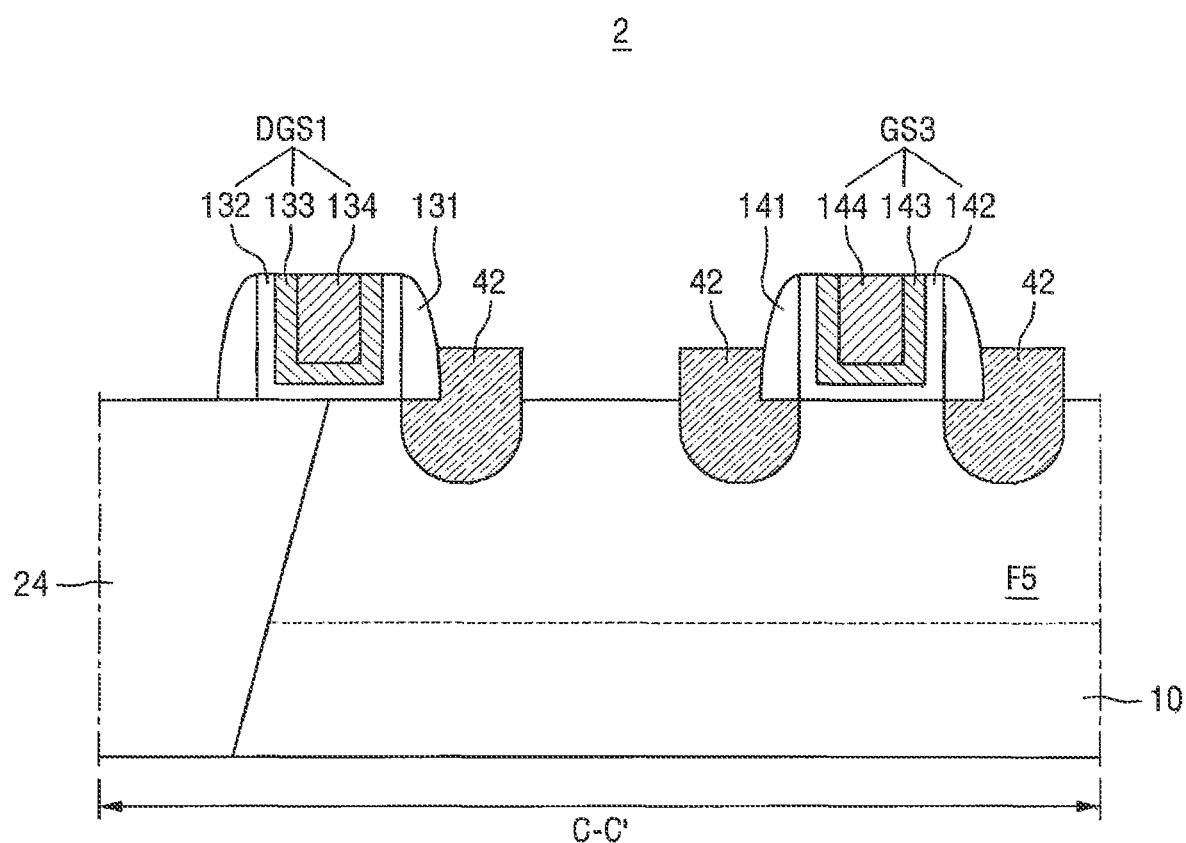
FIG. 6 is a cross-sectional view taken along the line C-C' of FIG. 5.

FIG. 5 is a layout view illustrating gate structures and active fins of a semiconductor device 2 according to another embodiment of the inventive concepts. FIG. 6 is a cross-sectional view taken along the line C-C' of FIG. 5. The following description will focus on differences between the present embodiment and the previously-described embodiment.

Referring to FIGS. 5 and 6, the semiconductor device 2 includes active fins F5 and F6, a gate structure GS3, a dummy gate structure DGS1, a field insulation layer 22 and a device isolation layer 24.

The active fins F5 and F6 may protrude from a substrate 10.

As illustrated in FIGS. 5 and 6, the active fins F5 and F6 may extend in, for example, a first direction X, and may be spaced apart from each other in a second direction Y. Each of the active fins F5 and F6 may have long sides and short sides.

The field insulation layer 22 may be formed on the substrate 10 and may cover lower portions of the long sides of the active fins F5 and F6 while exposing top portions of the active fins F5 and F6. As illustrated in FIGS. 5 and 6, the field insulation layer 22 may be adjacent the long sides of the active fins F5 and F6.

Although not specifically illustrated, line segments LS may be defined where the top surface of the field insulation layer 22 contacts the long sides of the active fins F5 and F6, as illustrated in FIG. 2. Some portions of these line segments LS may be covered by the gate structure GS3 and the dummy gate structure DGS1 while other portions of the line segments LS may be exposed.

The gate structure GS3 may extend in a second direction Y so as to intersect the active fins F5 and F6.

The gate structure GS3 may have substantially the same configuration as the gate structure GS1 illustrated in FIG. 1. In particular, the gate insulation layer 142 that is included in the gate structure GS3 may have substantially the same configuration as the gate insulation layer 112 that is included in the gate structure GS1, and a work function control layer 143 and a conductive layer 144 that are included in the gate structure GS3 may have substantially the same configurations as the work function control layer 113 and the conductive layer 114 that are included in the gate structure GS1.

The spacer 141 that is on at least one side of the gate structure GS3 may have substantially the same configuration as the spacer 111 that is formed on at least one side of the gate structure GS1.

Impurity epitaxial regions 42 may be formed on the active fins F5 and F6 at opposite sides of the gate structure GS3.

The device isolation layer 24 may extend from at least one side of the active fins F5 and F6 (e.g., the left side of FIG. 5) in the second direction Y. That is to say, the device isolation layer 24 may extend along short sides of the active fins F5 and F6 in the second direction Y. The device isolation layer 24 and the field insulation layer 22 may meet each other at regions where the long sides and short sides of the active fins F5 and F6 meet each other.

The dummy gate structure DGS1 may be spaced apart from the gate structure GS3 in the first direction X and may extend in the second direction Y. The dummy gate structure DGS1 may overlap the active fins F5 and F6 and the device isolation layer 24 to then extend in the second direction Y. That is to say, as illustrated, ends of the active fins F5 and F6 may be positioned under the dummy gate structure DGS1.

The dummy gate structure DGS1 may have substantially the same configuration as the gate structure GS3. In particular, a gate insulation layer 132 that is included in the dummy gate structure DGS1 may have substantially the same configuration as the gate insulation layer 142 that is included in the gate structure GS3, and a work function control layer 133 and a conductive layer 134 that are included in the dummy gate structure DGS1 may have substantially the same configurations as the work function control layer 143 and the conductive layer 144 that are included in the gate structure GS3.

A spacer 131 that is formed on at least one side of the dummy gate structure DGS1 may have substantially the same configuration as the spacer 141 that is formed on at least one side of the gate structure GS3.

The impurity epitaxial layer 42 may be formed on the active fins F5 and F6 on one side of the dummy gate structure DGS1.

In the present embodiment, each gate structure GS3, DGS1 may include a skirt S at each region where a side of the gate structure DGS1, GS3 intersects a long side of one of the active fins F5, F6.

The skirts S may extend outwardly from the dummy gate structure DGS1 and the gate structure GS3 in the first direction X to cover some portions of respective line segments LS that are defined by the intersections of the top surface of the field insulation layer 22 with the active fins F5 and F6 while exposing other portions of the line segments LS.

For example, as illustrated in FIG. 5, a ninth skirt S-9 extends outwardly from the right side surface of the dummy gate structure DGS1 in the first direction X to contact a first long side of the active fin F5, a tenth skirt S-10 extends outwardly from the left side surface of the gate structure GS3 in the first direction X to contact the first long side of the active fin F5, and an eleventh skirt S-11 extends outwardly from the right side surface of the gate structure GS3 in the first direction X to contact the first long side of the active fin F5.

The ninth skirt S-9 that extends outwardly from the right side surface of the dummy gate structure DGS1 in the first direction X to contact the first long side of the active fin F5 and the tenth skirt S-10 that extends outwardly from the left side surface of the gate structure GS3 in the first direction X to contact the first long side of the active fin F5 may not be connected to each other but may be separated from each other, as illustrated.

As illustrated, since the left side surface of the dummy gate structure DGS1 does not intersect the active fins F5 and F6, no skirt S may be formed on the left side surface of the dummy gate structure DGS1.

Figure 7:
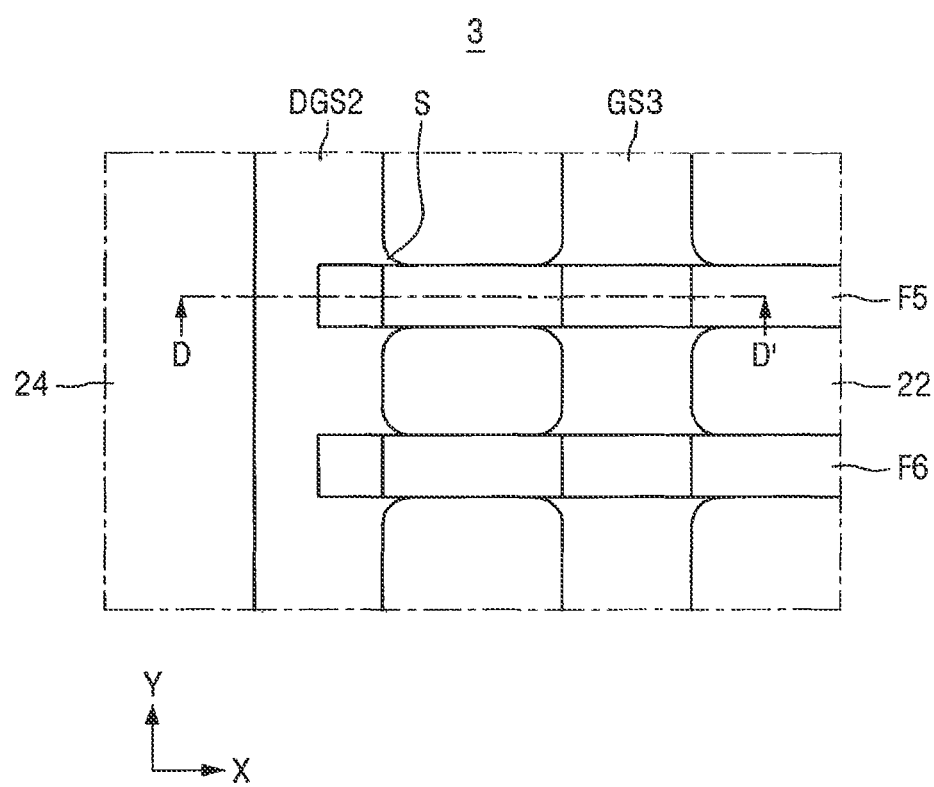
FIG. 7 is a layout view illustrating a gate structure and active fins of a semiconductor device according to still another embodiment of the inventive concepts.
Figure 8:
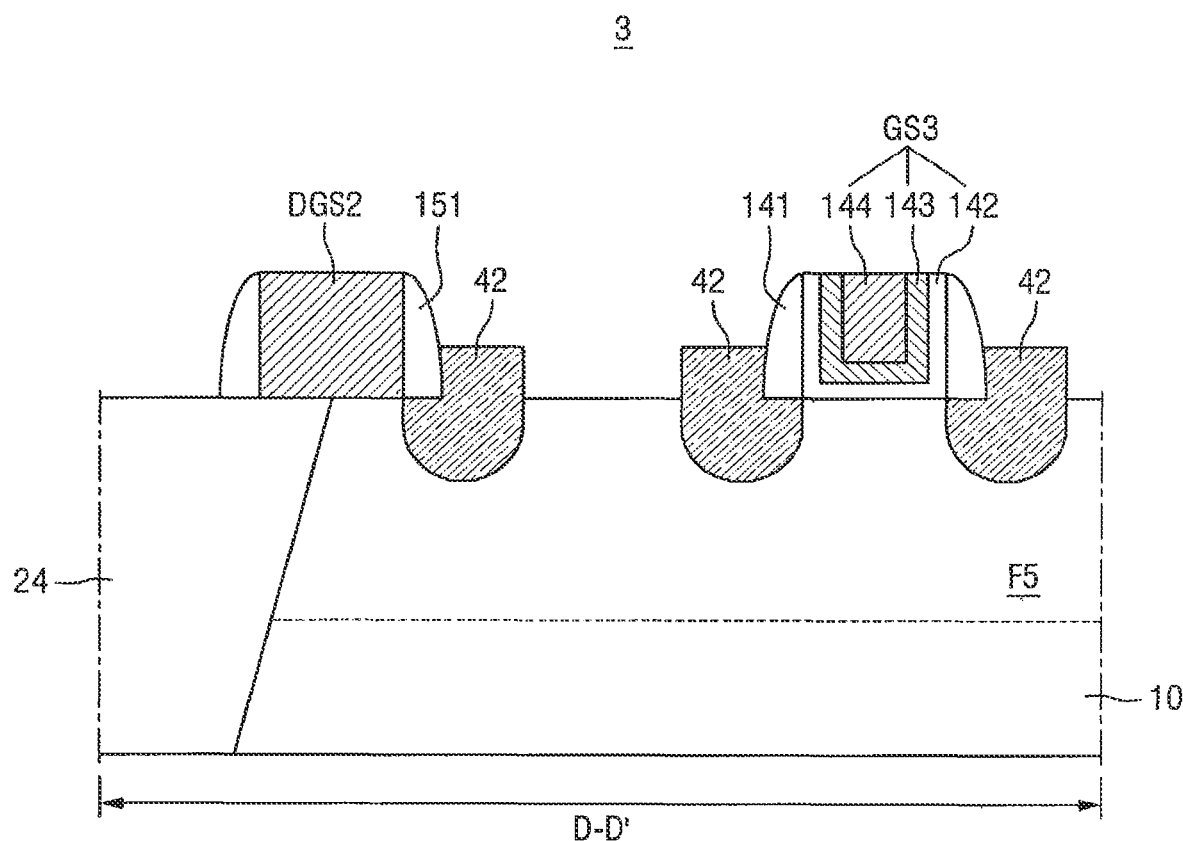
FIG. 8 is a cross-sectional view taken along the line D-D' of FIG. 7.

FIG. 7 is a layout view illustrating a gate structure and active fins of a semiconductor device according to still another embodiment of the inventive concepts. FIG. 8 is a cross-sectional view taken along the line D-D' of FIG. 7. The following description will focus on differences between the present embodiment and the previously described embodiments.

Referring to FIGS. 7 and 8, the semiconductor device 3 according to the present embodiment is different from the semiconductor device 2 in that it has a different dummy gate structure configuration.

In detail, while the dummy gate structure DGS1 of the semiconductor device 2 includes the gate insulation layer 132, the work function control layer 133, and the conductive layer 134, the dummy gate structure DGS2 of the semiconductor device 3 may only include a conductive layer including, for example, Si or poly-Si.

As illustrated in FIG. 8, a spacer 151 may be formed on at least one side of the dummy gate structure DGS2.

Figure 9A:
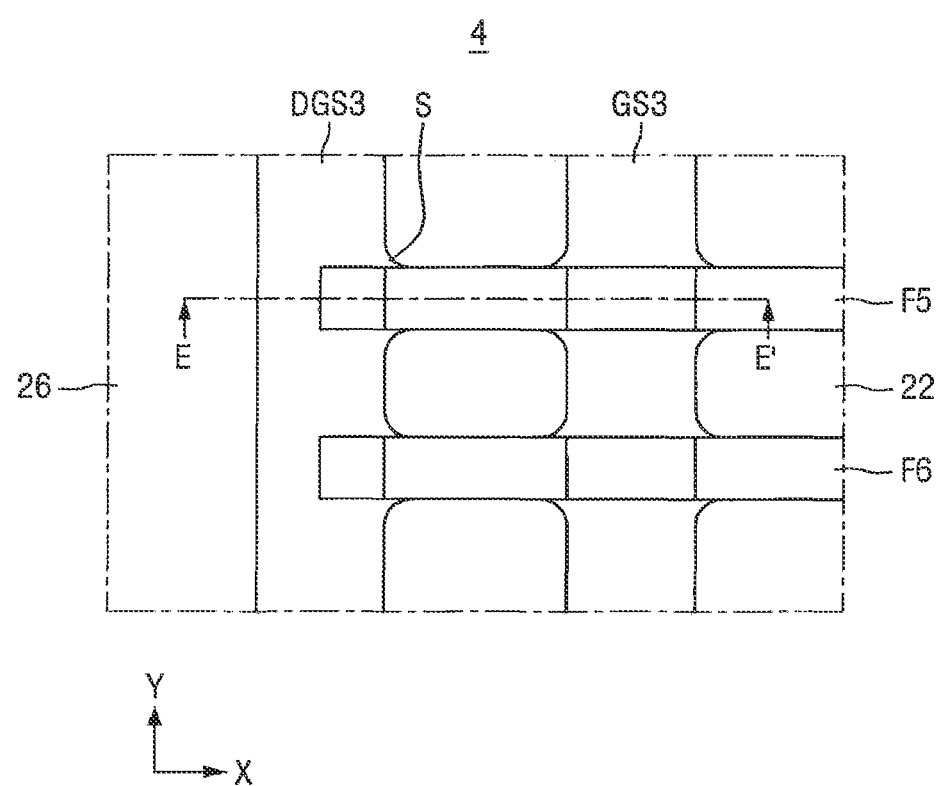
FIG. 9A is a layout view illustrating gate structures and active fins of a semiconductor device according to still another embodiment of the inventive concepts.
Figure 9B:
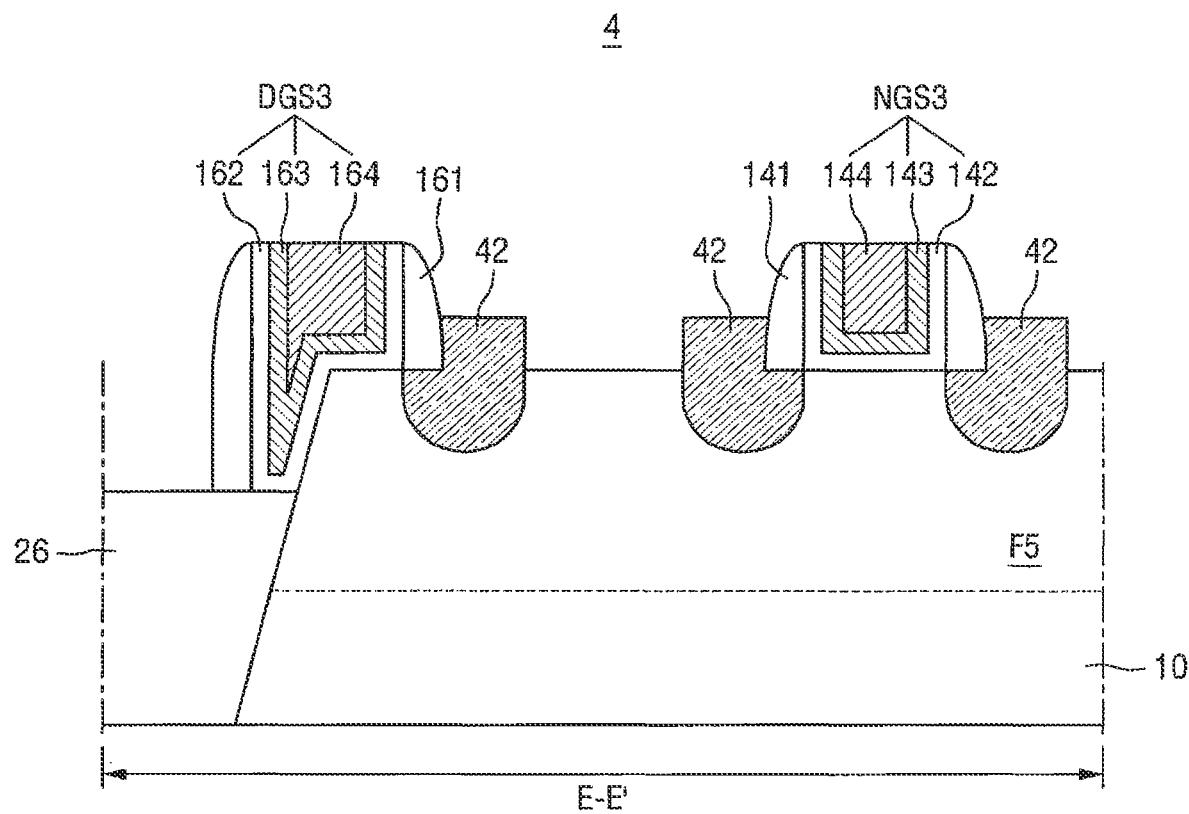
FIG. 9B is a cross-sectional view taken along the line E-E' of FIG. 9A.

FIG. 9A is a layout view illustrating the gate structures and active fins of a semiconductor device according to still another embodiment of the inventive concepts. FIG. 9B is a cross-sectional view taken along the line E-E' of FIG. 9A. The following description will focus on differences between the present embodiment and the previously described embodiments.

Referring to FIGS. 9A and 9B, the semiconductor device 4 according to the present embodiment is different from the semiconductor device 2 according to the previous embodiment in view of a configuration of a device isolation layer.

In detail, unlike in the semiconductor device 2 according to the previous embodiment in which a top surface of the device isolation layer 24 is positioned at substantially the same height as top surfaces of the active fins F5 and F6, in the semiconductor device 4 according to the present embodiment, a top surface of the device isolation layer 26 may be lower than the top surfaces of the active fins F5 and F6.

Accordingly, as illustrated in FIGS. 9A and 9B, a portion of the dummy gate structure DGS3 may extend below the top surfaces of the active fins F5 and F6 and the other portion of the dummy gate structure DGS3 may be higher than the top surfaces of the active fins F5 and F6.

Except for the difference in view of configuration, the dummy gate structure DGS3 may have substantially the same configuration with the dummy gate structure DGS1 of the semiconductor device 2 illustrated in FIGS. 5 and 6.

That is to say, a gate insulation layer 162 that is included in the dummy gate structure DGS3 may have substantially the same configuration as the gate insulation layer 132 that is included in the dummy gate structure DGS1, and a work function control layer 163 and a conductive layer 164 that are included in the dummy gate structure DGS3 may have substantially the same configurations as the work function control layer 133 and the conductive layer 134 that are included in the dummy gate structure DGS1.

A spacer 161 that is formed on at least one side of the dummy gate structure DGS3 may have substantially the same configuration as the spacer 131 that is formed on at least one side of the dummy gate structure DGS1.

Figure 10:
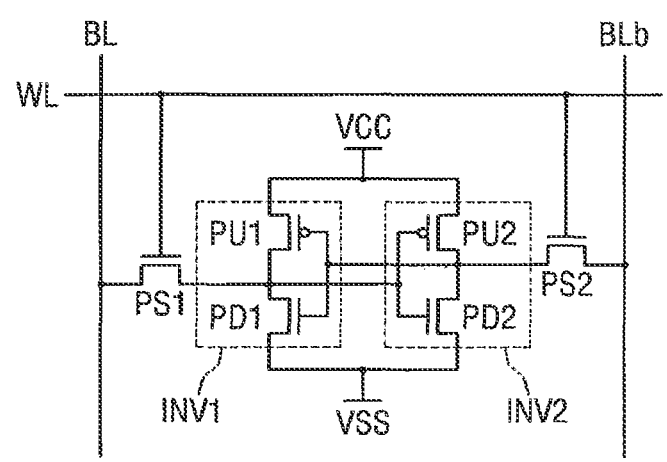
FIG. 10 is a circuit view illustrating a semiconductor device according to still another embodiment of the inventive concepts.
Figure 11:
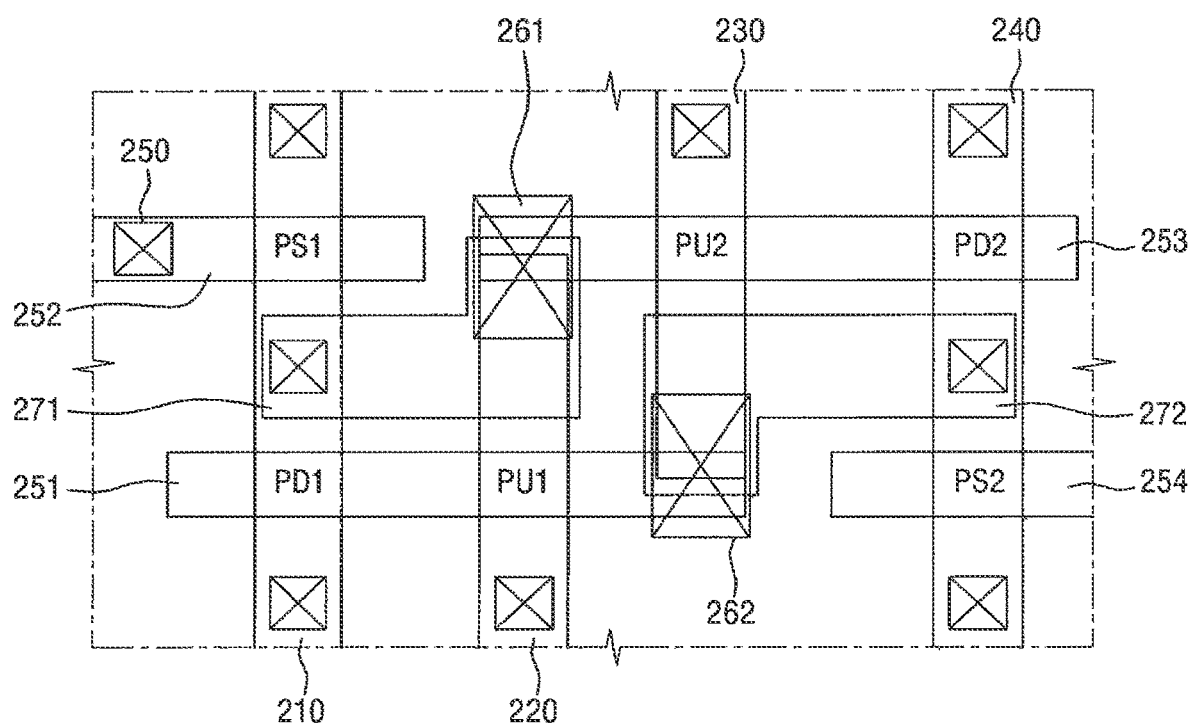
FIG. 11 is a layout view of the semiconductor device of FIG. 10.

FIG. 10 is a circuit diagram illustrating a semiconductor device according to still another embodiment of the inventive concepts. FIG. 11 is a layout view of the semiconductor device of FIG. 10.

Referring to FIG. 10, the semiconductor device may include a pair of inverters INV1 and INV2 that are electrically connected in parallel between a power supply node VCC and a ground node VSS, and a first pass transistor PS1 and a second pass transistor PS2 that are connected to the respective output nodes of the inverters INV1 and INV2. The first pass transistor PS1 and the second pass transistor PS2 may be connected to a bit line BL and a complementary bit line BLb, respectively. Gates of the first pass transistor PS1 and the second pass transistor PS2 may be connected to a word line WL.

The first inverter INV1 includes a first pull-up transistor PU1 and a first pull-down transistor PD1 that are electrically connected in series to each other, and the second inverter INV2 includes a second pull-up transistor PU2 and a second pull-down transistor PD2 that are electrically connected in series to each other. The first pull-up transistor PU1 and the second pull-up transistor PU2 may be PFET transistors, and the first pull-down transistor PD1 and the second pull-down transistor PD2 may be NFET transistors.

In addition, in order to constitute a latch circuit, an input node of the first inverter INV1 is connected to an output node of the second inverter INV2 and an input node of the second inverter INV2 is connected to an output node of the first inverter INV1.

Referring to FIGS. 10 and 11, a first active fin 210, a second active fin 220, a third active fin 230 and a fourth active fin 240, which are spaced apart from one another, may extend lengthwise in one direction (for example, in an up-down direction of FIG. 11). Here, the second active fin 220 and the third active fin 230 may be shorter in length than the first active fin 210 and the fourth active fin 240.

In addition, a first gate electrode 251, a second gate electrode 252, a third gate electrode 253, and a fourth gate electrode 254 are formed to extend lengthwise in the other direction (for example, in a left-right direction of FIG. 11). Each of the first through fourth gate electrodes 251-254 may intersect one or more of the first active fin 210 through the fourth active fin 240.

In detail, the first gate electrode 251 completely intersects the first active fin 210 and the second active fin 220 while partially overlapping a terminal of the third active fin 230. The third gate electrode 253 completely intersects the fourth active fin 240 and the third active fin 230 while partially overlapping a terminal of the second active fin 220. The second gate electrode 252 and the fourth gate electrode 254 are formed to intersect the first active fin 210 and the fourth active fin 240, respectively.

As illustrated, the first pull-up transistor PU1 is defined in the vicinity of an intersection of the first gate electrode 251 and the second active fin 220, the first pull-down transistor PD1 is defined in the vicinity of an intersection of the first gate electrode 251 and the first active fin 210, and the first pass transistor PS1 is defined in the vicinity of an intersection of the second gate electrode 252 and the first active fin 210. The second pull-up transistor PU2 is defined in the vicinity of an intersection of the third gate electrode 253 and the third active fin 230, the second pull-down transistor PD2 is defined in the vicinity of an intersection of the third gate electrode 253 and the fourth active fin 240, and the second pass transistor PS2 is defined in the vicinity of an intersection of the fourth gate electrode 254 and the fourth active fin 240.

Although not specifically illustrated, sources and drains may be formed at opposite sides of the respective intersections of the first to fourth gate electrodes 251-254 and the first to fourth active fins 210, 220, 230 and 240, and a plurality of contacts 250 may be formed.

Further, a first shared contact 261 may connect the second active fin 220, the third gate electrode 253, and a wiring 271 with one another. A second shared contact 262 may connect the third active fin 230, the first gate electrode 251 and a wiring 272 with one another.

At least one of the semiconductor devices according to some embodiments of the inventive concepts can be employed as the illustrated layout of the SRAM.

Figure 12:
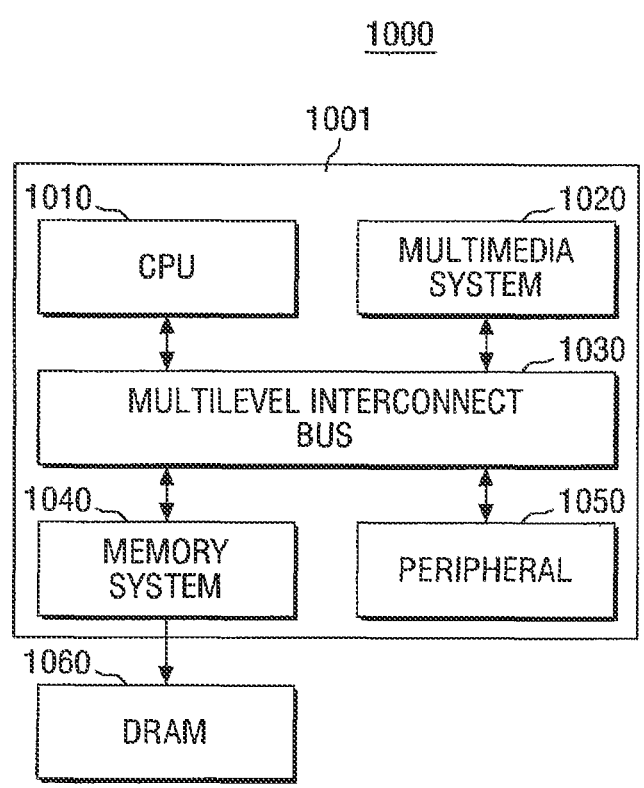
FIG. 12 is a block diagram of a System on Chip (SoC) system including semiconductor devices according to some embodiments of the inventive concepts.

FIG. 12 is a block diagram of a System on Chip (SoC) system including semiconductor devices according to embodiments of the inventive concepts.

Referring to FIG. 12, the SoC system 1000 may include an application processor 1001 and a DRAM 1060.

The application processor 1001 may include a central processing unit 1010, a multimedia system 1020, a bus 1030, a memory system 1040, and a peripheral circuit 1050.

The central processing unit 1010 may perform arithmetic operations necessary for operating the SoC system 1000. In some embodiments of the inventive concepts, the central processing unit 1010 may be configured in a multi-core environment including a plurality of cores.

The multimedia system 1020 may be used in performing a variety of multimedia functions in the SoC system 1000. The multimedia system 1020 may include a 3D engine module, a video codec, a display system, a camera system, and a post-processor.

The bus 1030 may be used to perform data communication among the central processing unit 1010, the multimedia system 1020, the memory system 1040, and the peripheral circuit 1050. In some embodiments of the inventive concepts, the bus 1030 may have a multi-layered structure. Examples of the bus 1030 may include a multi-layer advanced high-performance bus (AHB), or a multi-layer advanced eXtensible interface (AXI), but aspects of the inventive concepts are not limited thereto.

The memory system 1040 may provide environments necessary for high-speed operation by connecting the AP 1001 to an external memory (for example, the DRAM 1060). In some embodiments of the inventive concepts, the memory system 1040 may include a separate controller (for example, a DRAM controller) for controlling the external memory (for example, the DRAM 1060).

The peripheral circuit 1050 may provide environments necessary for smoothly connecting the SoC system 1000 to an external device (for example, a main board). Accordingly, the peripheral circuit 1050 may include various kinds of interfaces enabling the external device connected to the SoC system 1000 to be compatibly used.

The DRAM 1060 may function as a working memory of the AP 1001. In some embodiments of the inventive concepts, as illustrated, the DRAM 1060 may be disposed outside the AP 1001. In detail, the DRAM 1060 may be packaged with the AP 1001 in the form of a package on package (PoP).

At least one component of the SoC system 1000 may employ one of the aforementioned semiconductor devices according to embodiments of the inventive concepts.

Figure 13:
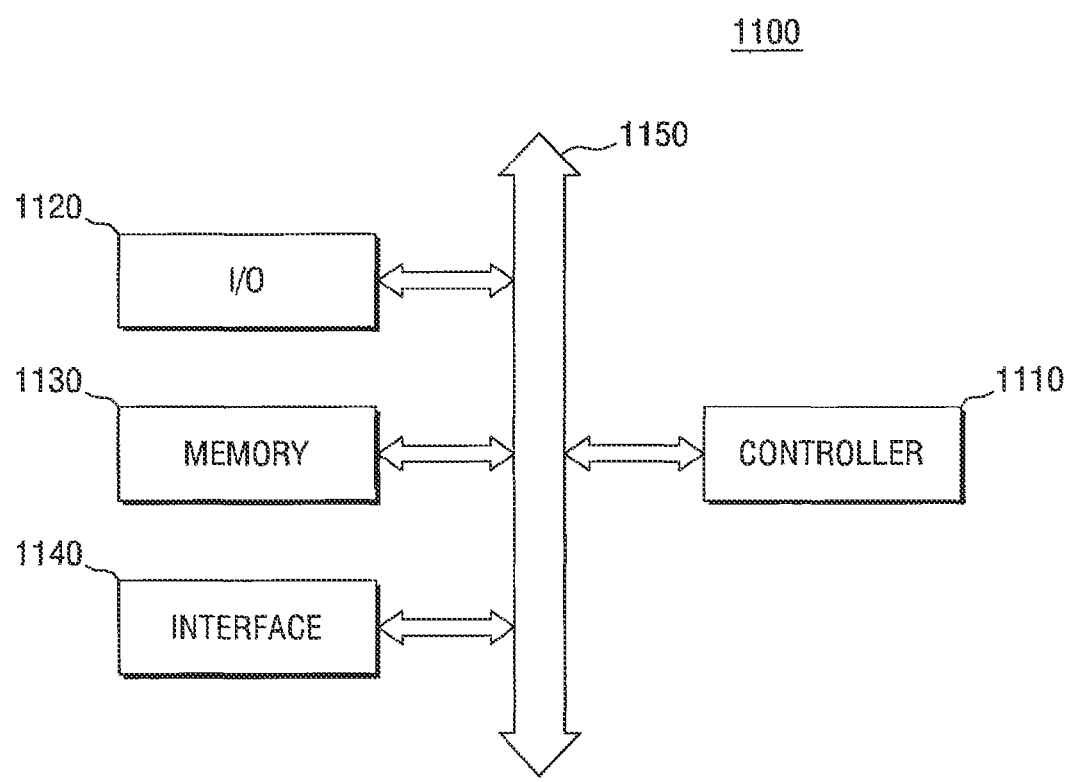
FIG. 13 is a block diagram of an electronic system including semiconductor devices according to some embodiments of the inventive concepts.

FIG. 13 is a block diagram of an electronic system including semiconductor devices according to embodiments of the inventive concepts.

Referring to FIG. 13, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network.

The interface 1140 may be wired or wireless. For example, the interface 1140 may include an antenna or a wired/wireless transceiver, and so on.

Although not illustrated, the electronic system 1100 may further include high-speed DRAM and/or SRAM as the working memory for improving the operation of the controller 1110. Semiconductor devices according to embodiments of the inventive concepts may be employed as the working memory.

In addition, semiconductor devices according to embodiments of the inventive concepts may be provided in the memory device 1130 or may be provided in some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 14:
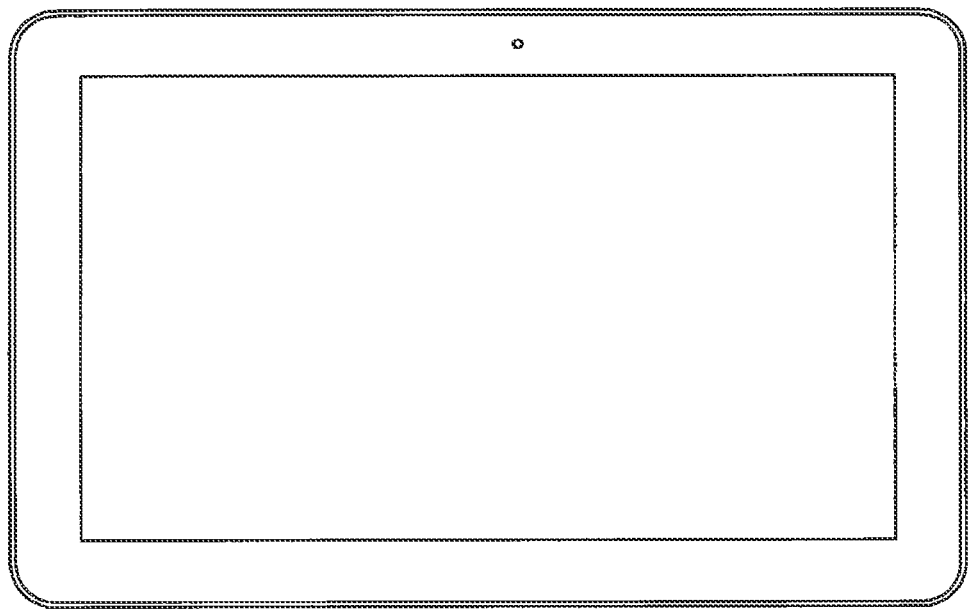
FIGS. 14 to 16 illustrate exemplary semiconductor systems to which semiconductor devices according to some embodiments of the inventive concepts can be applied.
Figure 15:
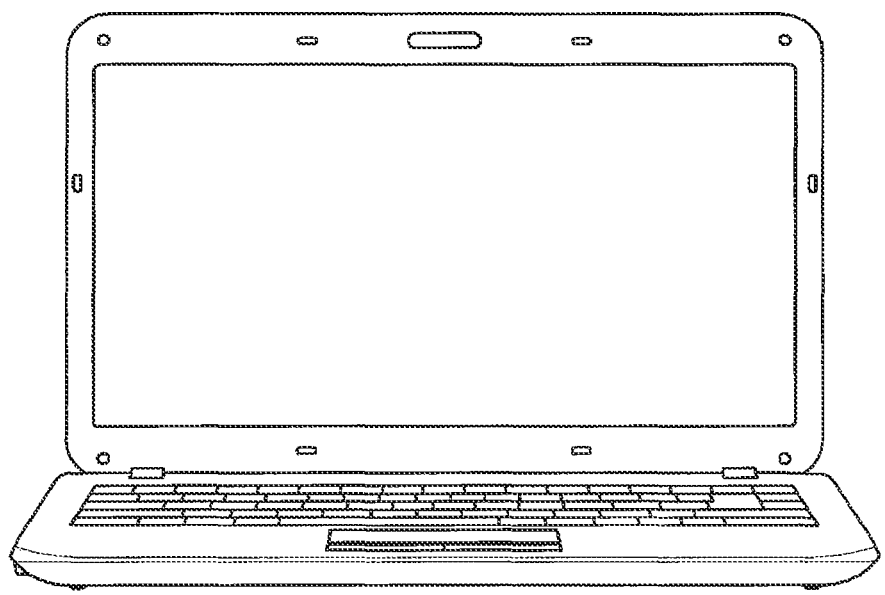
Figure 16:
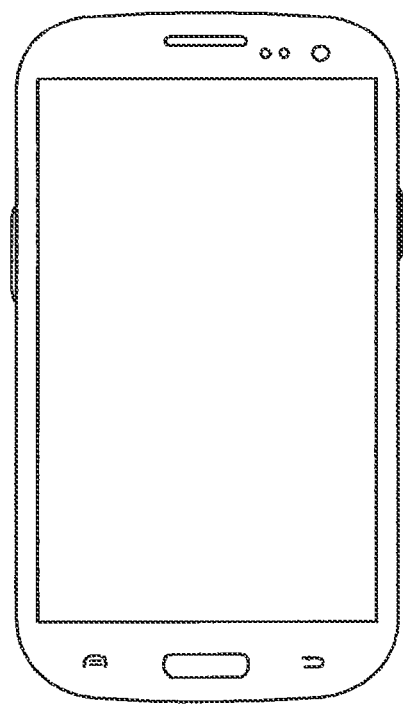

FIGS. 14 to 16 illustrate exemplary semiconductor systems to which semiconductor devices according to some embodiments of the inventive concepts can be applied.

FIG. 14 illustrates an example in which a semiconductor device according to an embodiment of the inventive concepts is applied to a tablet PC (1200), FIG. 15 illustrates an example in which a semiconductor device according to an embodiment of the inventive concepts is applied to a notebook computer (1300), and FIG. 16 illustrates an example in which a semiconductor device according to an embodiment of the inventive concepts is applied to a smart phone (1400). At least one of the semiconductor devices according to some embodiments of the inventive concepts can be employed to a tablet PC 1200, a notebook computer 1300, a smart phone 1400, and the like.

In addition, semiconductor devices according to some embodiments of the inventive concepts may also be applied to other integrated circuit devices not illustrated herein.

That is to say, in the above-described embodiments, only the tablet PC 1200, the notebook computer 1300 and the smart phone 1400 have been exemplified as including semiconductor devices according to embodiments of the inventive concepts, but aspects of the inventive concepts are not limited thereto.

In some embodiments of the inventive concepts, the semiconductor device may be implemented as a computer, an ultra mobile personal computer (UMPC), a work station, a net-book, a personal digital assistant (PDA), a portable computer, a web tablet, a wireless phone, a mobile phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, or the like.

FIGS. 17 to 20 are diagrams illustrating a method for fabricating semiconductor devices according to some embodiments of the inventive concepts.

Figure 17:
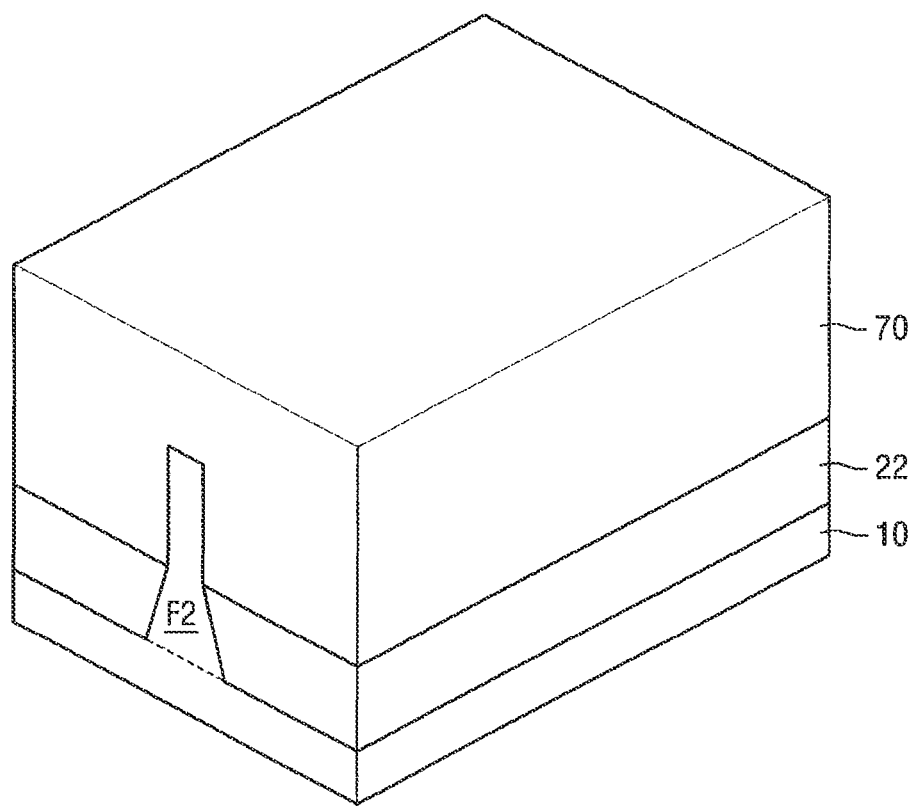
FIGS. 17 to 20 are diagrams illustrating a method for fabricating semiconductor devices according to some embodiments of the inventive concepts.

Referring to FIG. 17, an active fin F2 is formed to protrude upwardly from a substrate 10. The active fin F2 may extend in a first direction X1.

In detail, in some embodiments of the inventive concepts, the active fin F2 may be formed by etching the substrate 10. In other embodiments, the active fin F2 may be formed by forming an epitaxial layer including a semiconductor material on the substrate 10 and patterning the epitaxial layer.

Next, a field insulation layer 22 covering a bottom portion of the active fin F2 is formed on the substrate 10. Then, a conductive layer 72 is formed on the field insulation layer 22 and the active fin F2. Here, the conductive layer 72 may include, for example, polycrystalline silicon (poly-Si).

Figure 18:
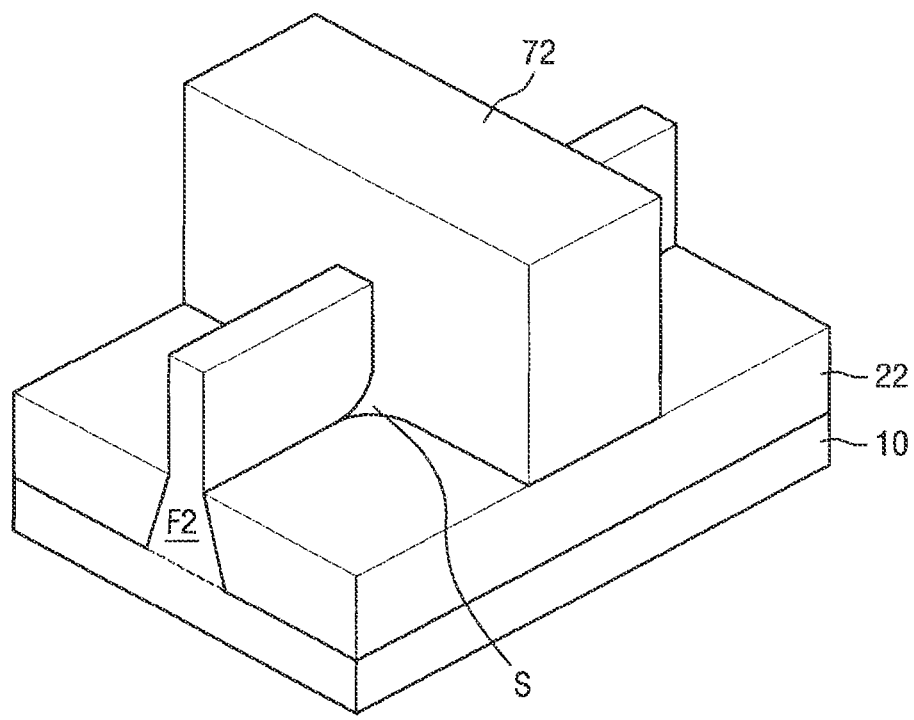

Next, referring to FIG. 18, the conductive layer 72 is patterned such that it intersects the active fin F2. The conductive layer 72 may be patterned to form skirts S at regions where the conductive layer 72 and the active fin F2 are adjacent each other.

Figure 19:
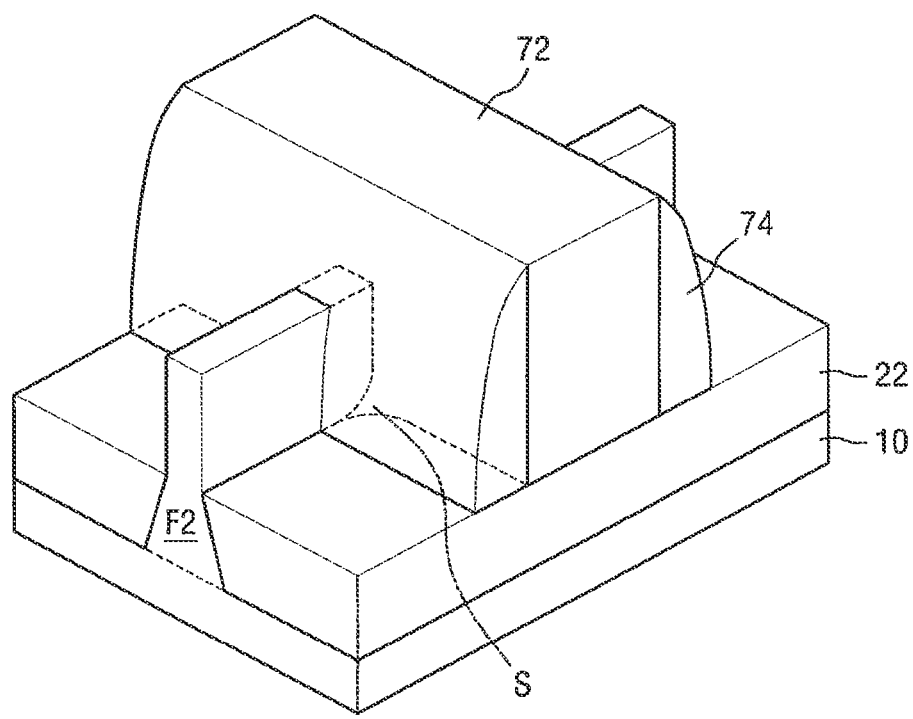

Referring to FIG. 19, spacers 74 may be formed at opposite sides of the conductive layer 72. The spacers 74 may include, for example, an insulating material such as, for example, a silicon nitride layer or a silicon oxynitride layer.

Figure 20:
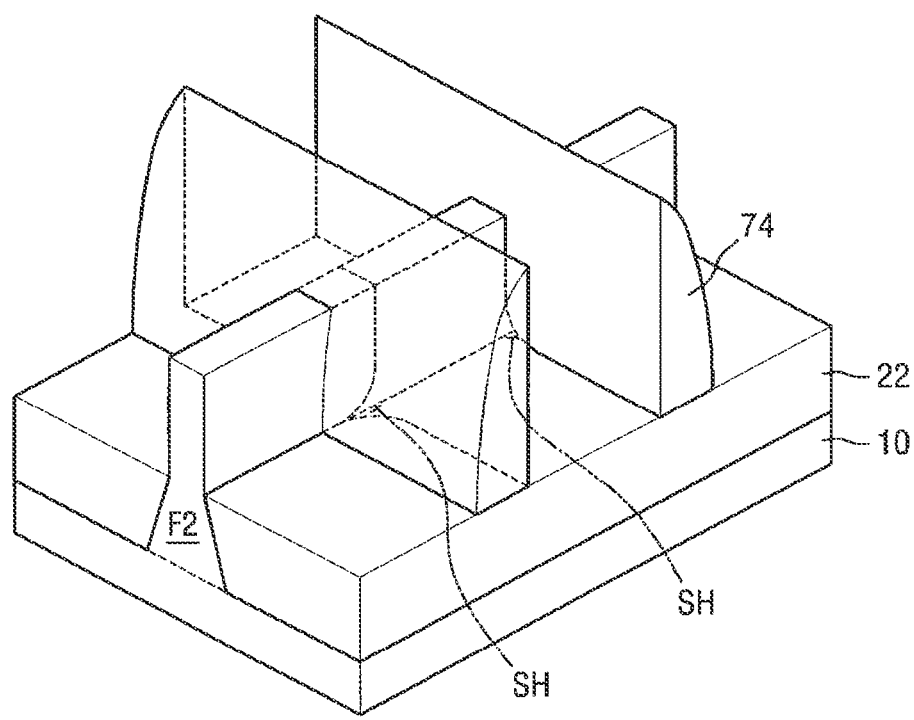

Referring to FIG. 20, the conductive layer (72 of FIG. 19) is removed. As a result of removing the conductive layer (72 of FIG. 19), skirt holes SH may be formed under the spacers 74.

Thereafter, a gate structure GS1, including a gate insulation layer (e.g., 112 of FIG. 3), a work function control layer (e.g., 113 of FIG. 3), and a conductive layer (e.g., 114 of FIG. 3), is formed between the spacers 74, and the gate structures GS1 to GS3 of the semiconductor devices 1 to 4 may be formed in substantially the same manner.

Further, a device isolation layer (for example, 24 of FIG. 6, 26 of FIG. 9B) may be formed at one side of the active fin F2, the dummy gate structures DGS1 and DGS3 of the semiconductor devices 2 and 4 may be formed in substantially the same manner.

Finally, if the conductive layer 72 illustrated in FIG. 19 is allowed to remain without being removed, the dummy gate structure DGS2 of the semiconductor device 3 may also be formed.

While the inventive concepts have been particularly shown and described with reference to exemplary embodiments thereof, it will be understood by those of ordinary skill in the art that various changes in form and details may be made therein without departing from the spirit and scope of the inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A semiconductor device comprising:
a first active fin protruding from a substrate and extending in a first direction;
a second active fin protruding from the substrate and extending in the first direction, wherein the second active fin is spaced apart from the first active fin in a second direction that intersects the first direction; and
a first gate structure extending in the second direction, the first gate structure includes a gate insulation layer, a work function control layer on the gate insulation layer and a conductive layer on the work function control layer,
wherein the first gate structure includes a first skirt where a first side of the first gate structure extends outwardly in the first direction to contact a side surface of the first active fin, a second skirt where a second side of the first gate structure, which is opposite the first side of the first gate structure, extends outwardly in the first direction to contact the side surface of the first active fin, a third skirt where the first side of the first gate structure extends outwardly in the first direction to contact a side surface of the second active fin, and a fourth skirt where the second side of the first gate structure extends outwardly in the first direction to contact the side surface of the second active fin,
wherein each of outer surfaces of the first skirt, the second skirt, the third skirt, and the fourth skirt has a first concave profile at a lower half portion of the first gate structure in a vertical plane,
wherein each of the outer surfaces of the first skirt, the second skirt, the third skirt, and the fourth skirt has a second concave profile in a horizontal plane,
wherein an entirety of the first skirt having the first concave profile in the vertical plane continuously decreases in width, in the first direction, with increasing height above a surface of the substrate,
wherein the entirety of the first skirt having the second concave profile in the horizontal plane continuously increases in width, in the first direction, with decreasing distance to the side surface of the first active fin,
wherein the first skirt includes the gate insulation layer and the work function control layer, an outer surface of the gate insulation layer of the first skirt has the first concave profile in the vertical plane, and an outer surface of the work function control layer of the first skirt has a third concave profile in the vertical plane,
wherein an entirety of the work function control layer of the first skirt having the third concave profile in the vertical plane continuously decreases in width, in the first direction, with increasing height above the surface of the substrate, and
wherein the second concave profile in the horizontal plane converges with the first concave profile in the vertical plane.

2. The semiconductor device of claim 1, wherein a width of the first gate structure in the first direction decreases from the side surface of the first active fin to a region between the first active fin and the second active fin.

3. The semiconductor device of claim 1, further comprising a dummy gate structure extending in the second direction, to cross the first active fin, the first active fin having an end in the first direction under the dummy gate structure, wherein the dummy gate structure is spaced apart from the first gate structure in the first direction, and
wherein the dummy gate structure includes a fifth skirt where a first side of the dummy gate structure facing the first side of the first gate structure extends outwardly in the first direction to contact the side surface of the first active fin and a sixth skirt where the first side of the dummy gate structure extends outwardly in the first direction to contact the side surface of the second active fin.

4. The semiconductor device of claim 3, wherein an outer surface of the fifth skirt has a fourth concave profile at a lower half portion of the dummy gate structure in the vertical plane,
wherein the outer surface of the fifth skirt has a fifth concave profile in the horizontal plane, and
wherein an entirety of the fifth skirt having the fourth concave profile in the vertical plane continuously decreases in width, in the first direction, with increasing height above the surface of the substrate.

5. The semiconductor device of claim 3, wherein a second side of the dummy gate structure, which is opposite the first side of the dummy gate structure, is a planar side surface that does not include any skirt.

6. The semiconductor device of claim 3, further comprising a device isolation layer that extends in the second direction and is contact with the end of the first active fin, wherein the dummy gate structure is on the first active fin and the device isolation layer.

7. The semiconductor device of claim 1, further comprising a second gate structure extending in the second direction, wherein the second gate structure is spaced apart from the first gate structure, and
wherein the second gate structure includes a seventh skirt where a first side of the second gate structure facing the second side of the first gate structure extends outwardly in the first direction to contact a side surface of the first active fin and an eighth skirt where the first side of the second gate structure extends outwardly in the first direction to contact the side surface of the second active fin.

8. The semiconductor device of claim 7, wherein each of outer surfaces of the seventh and eighth skirts has the first concave profile at a lower half portion of the second gate structure in the vertical plane,
wherein each of the outer surfaces of the seventh and eighth skirts has the second concave profile in the horizontal plane, and
wherein an entirety of the seventh skirt having the first concave profile in the vertical plane continuously decreases in width, in the first direction, with increasing height above the surface of the substrate.

9. The semiconductor device of claim 7, wherein a distance between the first gate structure and the second gate structure in the first direction increases from the side surface of the first active fin to a region between the first active fin and the second active fin.

10. A semiconductor device comprising:
a first active fin protruding from a substrate and extending in a first direction;
a second active fin protruding from the substrate and extending in the first direction, wherein the second active fin is spaced apart from the first active fin in a second direction that intersects the first direction; and
a first gate structure extending in the second direction, the first gate structure includes a gate insulation layer, a work function control layer on the gate insulation layer and a conductive layer on the work function control layer,
wherein the first gate structure includes a first skirt where a first side of the first gate structure extends outwardly in the first direction to contact a side surface of the first active fin,
wherein an outer surface of the first skirt has a first concave profile at a lower half portion of the first gate structure in a vertical plane,
wherein the outer surface of the first skirt has a second concave profile in a horizontal plane,
wherein an entirety of the first skirt having the first concave profile in the vertical plane continuously decreases in width, in the first direction, with increasing height above a surface of the substrate,
wherein the first skirt includes the gate insulation layer and the work function control layer, an outer surface of the gate insulation layer of the first skirt has the first concave profile in the vertical plane, and an outer surface of the work function control layer of the first skirt has a third concave profile in the vertical plane,
wherein an entirety of the work function control layer of the first skirt having the third concave profile in the vertical plane continuously decreases in width, in the first direction, with increasing height above the surface of the substrate, and wherein the second concave profile in the horizontal plane converges with the first concave profile in the vertical plane.

11. The semiconductor device of claim 10, wherein the entirety of the first skirt having the second concave profile in the horizontal plane continuously increases in width, in the first direction, with decreasing distance to the side surface of the first active fin.

12. The semiconductor device of claim 10, wherein the first gate structure further includes a second skirt where a second side of the first gate structure, which is opposite the first side of the first gate structure, extends outwardly in the first direction to contact the side surface of the first active fin, a third skirt where the first side of the first gate structure extends outwardly in the first direction to contact a side surface of the second active fin, and a fourth skirt where the second side of the first gate structure extends outwardly in the first direction to contact the side surface of the second active fin.

13. The semiconductor device of claim 10, further comprising a dummy gate structure extending in the second direction, to cross the first active fin, the first active fin having an end in the first direction under the dummy gate structure, wherein the dummy gate structure is spaced apart from the first gate structure in the first direction, and
wherein the dummy gate structure includes a fifth skirt where a first side of the dummy gate structure facing the first side of the first gate structure extends outwardly in the first direction to contact the side surface of the first active fin, and a sixth skirt where the first side of the dummy gate structure extends outwardly in the first direction to contact the side surface of the second active fin.

14. The semiconductor device of claim 13, wherein an outer surface of the fifth skirt has a fourth concave profile at a lower half portion of the dummy gate structure in the vertical plane,
wherein the outer surface of the fifth skirt has a fifth concave profile in the horizontal plane, and
wherein an entirety of the fifth skirt having the fourth concave profile in the vertical plane continuously decreases in width, in the first direction, with increasing height above the surface of the substrate.

15. The semiconductor device of claim 10, further comprising a second gate structure extending in the second direction, wherein the second gate structure is spaced apart from the first gate structure,
wherein the second gate structure includes a seventh skirt where a first side of the second gate structure facing a second side of the first gate structure extends outwardly in the first direction to contact a side surface of the first active fin and an eighth skirt where the first side of the second gate structure extends outwardly in the first direction to contact the side surface of the second active fin.

16. A semiconductor device comprising:
a first active fin protruding from a substrate and extending in a first direction;
a second active fin protruding from the substrate and extending in the first direction, wherein the second active fin is spaced apart from the first active fin in a second direction that intersects the first direction; and
a first gate structure extending in the second direction,
wherein the first gate structure includes a first skirt where a first side of the first gate structure extends outwardly in the first direction to contact a side surface of the first active fin, a second skirt where a second side of the first gate structure, which is opposite the first side of the first gate structure, extends outwardly in the first direction to contact the side surface of the first active fin, a third skirt where the first side of the first gate structure extends outwardly in the first direction to contact a side surface of the second active fin, and a fourth skirt where the second side of the first gate structure extends outwardly in the first direction to contact the side surface of the second active fin, wherein each of outer surfaces of the first skirt, the second skirt, the third skirt, and the fourth skirt has a first concave profile at a lower half portion of the first gate structure in a vertical plane, wherein each of the outer surfaces of the first skirt, the second skirt, the third skirt, and the fourth skirt has a second concave profile in a horizontal plane, wherein an entirety of the first skirt having the first concave profile in the vertical plane continuously decreases in width, in the first direction, with increasing height above a surface of the substrate, wherein the entirety of the first skirt having the second concave profile in the horizontal plane continuously increases in width, in the first direction, with decreasing distance to the side surface of the first active fin, wherein the second concave profile in the horizontal plane converges with the first concave profile in the vertical plane, and wherein a first width of the first gate structure in the first direction decreases from the side surface of the first active fin to a region between the first active fin and the second active fin.

17. The semiconductor device of claim 16, wherein the first gate structure includes a gate insulation layer, a work function control layer on the gate insulation layer and a conductive layer on the work function control layer.

18. The semiconductor device of claim 16, further comprising a second gate structure extending in the second direction, wherein the second gate structure is spaced apart from the first gate structure, wherein the second gate structure includes a fifth skirt where a first side of the second gate structure facing the second side of the first gate structure extends outwardly in the first direction to contact a side surface of the first active fin and a sixth skirt where the first side of the second gate structure extends outwardly in the first direction to contact the side surface of the second active fin.

19. The semiconductor device of claim 18, wherein a distance between the first gate structure and the second gate structure in the first direction increases from the side surface of the first active fin to a region between the first active fin and the second active fin.

* * * * *